(12) United States Patent
Folkesson et al.

(10) Patent No.: US 7,092,685 B2
(45) Date of Patent: Aug. 15, 2006

(54) METHOD FOR TUNING A RADIO FILTER AND A SYSTEM FOR TUNING A RADIO FILTER

(75) Inventors: Rolf Folkesson, Brottby (SE); Lennart Larsson, Akersberga (SE)

(73) Assignee: Allgon AB, Taby (SE)

( * ) Notice: Subject to any disclaimer, the term of this patent is extended or adjusted under 35 U.S.C. 154(b) by 227 days.

(21) Appl. No.: 10/451,142

(22) PCT Filed: Dec. 21, 2001

(86) PCT No.: PCT/SE01/02888

§ 371 (c)(1),
(2), (4) Date: Dec. 31, 2003

(87) PCT Pub. No.: WO02/052673

PCT Pub. Date: Jul. 4, 2002

(65) Prior Publication Data

US 2004/0097203 A1    May 20, 2004

(30) Foreign Application Priority Data

Dec. 27, 2000    (SE) ................................ 0004863

(51) Int. Cl.
*H01Q 11/12*    (2006.01)
(52) U.S. Cl. ................ 455/125; 455/121; 375/304
(58) Field of Classification Search ............ 455/115.1, 455/120, 125, 121, 115; 375/304, 295
See application file for complete search history.

(56) References Cited

U.S. PATENT DOCUMENTS

| | | | |
|---|---|---|---|
| 3,710,150 A * | 1/1973 | McMaster | 310/323.19 |
| 5,717,368 A | 2/1998 | Niiranen | 333/202 |
| 6,041,083 A * | 3/2000 | Larsson et al. | 375/304 |
| 6,246,727 B1 * | 6/2001 | Larsson et al. | 375/304 |
| 6,760,079 B1 * | 7/2004 | Morisada | 348/731 |

* cited by examiner

*Primary Examiner*—Nguyen T. Vo
*Assistant Examiner*—Nhan T. Le
(74) *Attorney, Agent, or Firm*—Jacobson Holman PLLC

(57) ABSTRACT

The present invention relates to a method and a system for tuning a radio filter. The radio filter comprises at least one resonator module, each of said at least one resonator module having a tuning mechanism, a filter input connection, a filter output connection. High frequency broad band input and output signals of each of said at least one resonator module are sensed and processed to tune the radio filter. The processing of the sensed input and output signals includes processing in a low-frequency range.

10 Claims, 4 Drawing Sheets

METHOD FOR TUNING A RADIO FILTER AND A SYSTEM FOR TUNING A RADIO FILTER

This is a nationalization of PCT/SE01/02888 filed Dec. 21, 2001 and published in English.

TECHNICAL FIELD

The present invention relates to a method for tuning a radio filter comprising at least one resonator module. The invention also relates to a system for tuning a radio filter.

BACKGROUND OF THE INVENTION

The control system in present autotuned combiners works independently for each resonator module (channel), the phase is measured in each resonator module and the position of the tuning mechanism is adjusted accordingly. In U.S. Pat. No. 6,041,083, by Larsson et al., which is hereby incorporated by reference, the processing is done in one control unit, switching between channels, but the measured data and response is for one channel at a time, see FIG. 1.

The problem with the described control system is that it requires an input signal time slot, that is long enough to do the phase measurement in the resonators, since the same regulation circuitry are used to measure the phase of the reference signal and each resonator signal.

SUMMARY OF THE INVENTION

The present invention seeks to provide a method for tuning a radio filter comprising at least one resonator modules and a control unit that automatically tunes the filter in response to the input signal to the filter which overcome the prior art problem.

According to an aspect of the present invention there is provided a method for tuning a radio filter as specified by claim 1 and claim 2.

The invention is further directed to a system for tuning a radio filter as specified in claim 7 and claim 9.

An advantage with the present invention is that discrete signals may be created of broadband signals, where each discrete signals contains amplitude and phase information which may be used to control the tuning frequency of a filter having only one or a multiple of cascade coupled resonator modules.

DETAILED DESCRIPTION OF PREFERRED EMBODIMENTS

Figure 1:
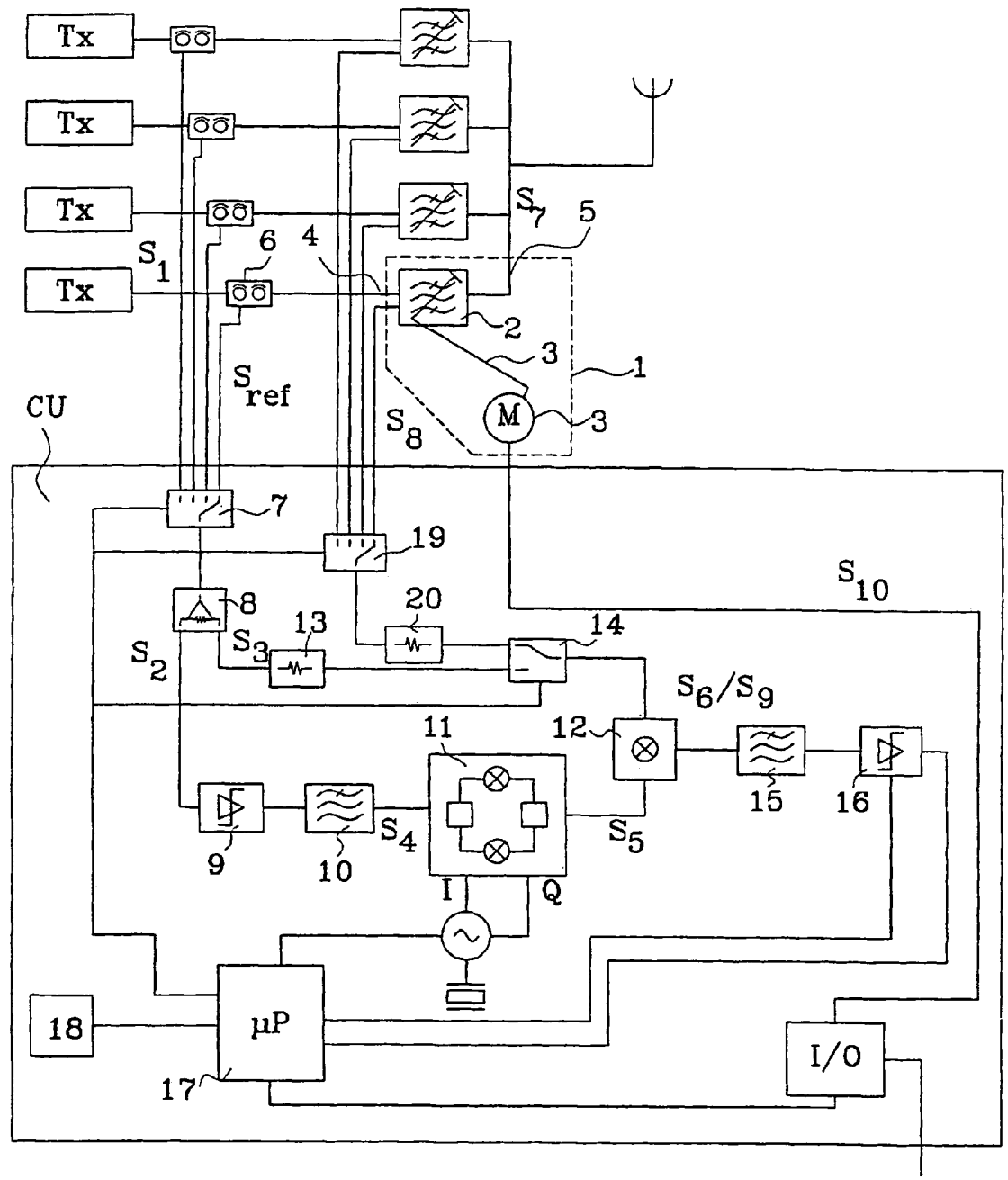
FIG. 1 shows a filter with control circuits according to prior art.

FIG. 1 shows a filter, or combiner unit, having four tunable resonator modules arranged to be connected to four transmitters via four respective isolators and to a common antenna. The tuning of the combiner unit is controlled by a control unit.

The prior art system for tuning a first resonator module 1 comprises a tunable resonator 2 having a tuning mechanism 3, an input connection 4 and an output connection 5. The system further comprises an isolator 6, through which an input signal $S_1$ passes from a transmitter to the input connection 4 of the resonator module 1. A reference signal $S_{ref}$ is produced within the isolator 6 that is essentially a small fraction of the input signal $S_1$.

The reference signal $S_{ref}$ is fed into a control unit CU via a first multiplexer 7 to a power splitter 8, which splits the reference signal in signals $S_2$ and $S_3$. The signal $S_2$ is fed via a limiting amplifier 9 and a band-pass filter 10, producing a signal $S_4$ which is input to a quadrature modulator (single side-band generator) 11, known per se, wherein the signal $S_4$, still being a measure of the input signal $s_1$, is mixed with a low-frequency (intermediate frequency) signal in immediate (0°) and quadrature (90°) phases I and Q, respectively. The output signal $S_5$ of the quadrature modulator is a single side band of the mixing product of signal $S_4$ derived from input signal $S_1$ and the low frequency signal. Consequently, a frequency of signal $S_5$ is always offset from input signal $S_1$ by the frequency of the low-frequency signal, the latter being constant. Signal $S_5$ is fed from the quadrature modulator 11 to a mixer 12.

Signal $S_3$ is fed from the power splitter 8 via an attenuator 13 and a second multiplexer 14 to the mixer 12. The mixer 12 thus produces from signals $S_3$ and $S_5$ a mixing product signal $S_6$ which is fed via a low-pass filter 15 and a second limiting amplifier 16 to a microprocessor 17 wherein the phase of the mixing product signal $S_6$ is measured and stored in a memory 18.

The system further includes a second sensor, or probe, arranged inside the resonator 2 for sensing a output signal $S_7$ to produce a measurement signal $S_8$, which is to be compared to the reference signal $S_{ref}$ in order to determine a relative phase difference. That phase difference is a measure of a relative difference between a frequency of the input signal and the frequency to which the resonator module is presently tuned. Signal $S_8$ is essentially a small fraction of the output signal $S_7$.

The measurement signal $S_8$ is fed into the control unit CU from the sensor via a third multiplexer 19, an attenuator 20 and the second multiplexer 14, which is alternatively switched to connect either signal $S_3$ or signal $S_8$, to the mixer 12. When the multiplexer 14 connects measurement signal $S_8$, the mixer thus produces from signals $S_5$ and $S_8$ a mixing product signal $S_9$ which is fed via the low-pass filter 15 and the second limiting amplifier 16 to the microprocessor 17 wherein the phase of the signal $S_9$ is measured and stored in the memory 18. The stored phase measurements are then compared to determine the phase difference between signals $S_6$ and $S_9$.

The microprocessor 17 operates by fast and accurate measurement of the phase of the input signal $S_1$ and regulation of the phase of the output signal $S_7$ relative thereto. For instance an electrical step motor, controlled by a signal $S_{10}$ from the microprocessor 17 performs adjustment of the first resonator module by moving, via a mechanical link, a tuning element in the resonator 2 of the resonator module 1.

The first and third multiplexers 7 and 19 are controlled by the microprocessor 17 so as to share the same regulation circuitry between four essentially identical resonance modules forming a combiner unit with four separate transmitters and one common antenna. Each resonator module is adjusted in turn essentially the same way as indicated above with reference to the first resonator module 1.

A disadvantage with the prior art Control Unit (CU) is that it may not be able to perform enough reliable measurements and calculations within an available time slot to establish the input-to-output phase difference.

Another disadvantage is that the CU may not be able to handle highly time variant signals, since the measurement of the reference signal and the actual signal within the resonator is made at two different occasions.

Figure 2:
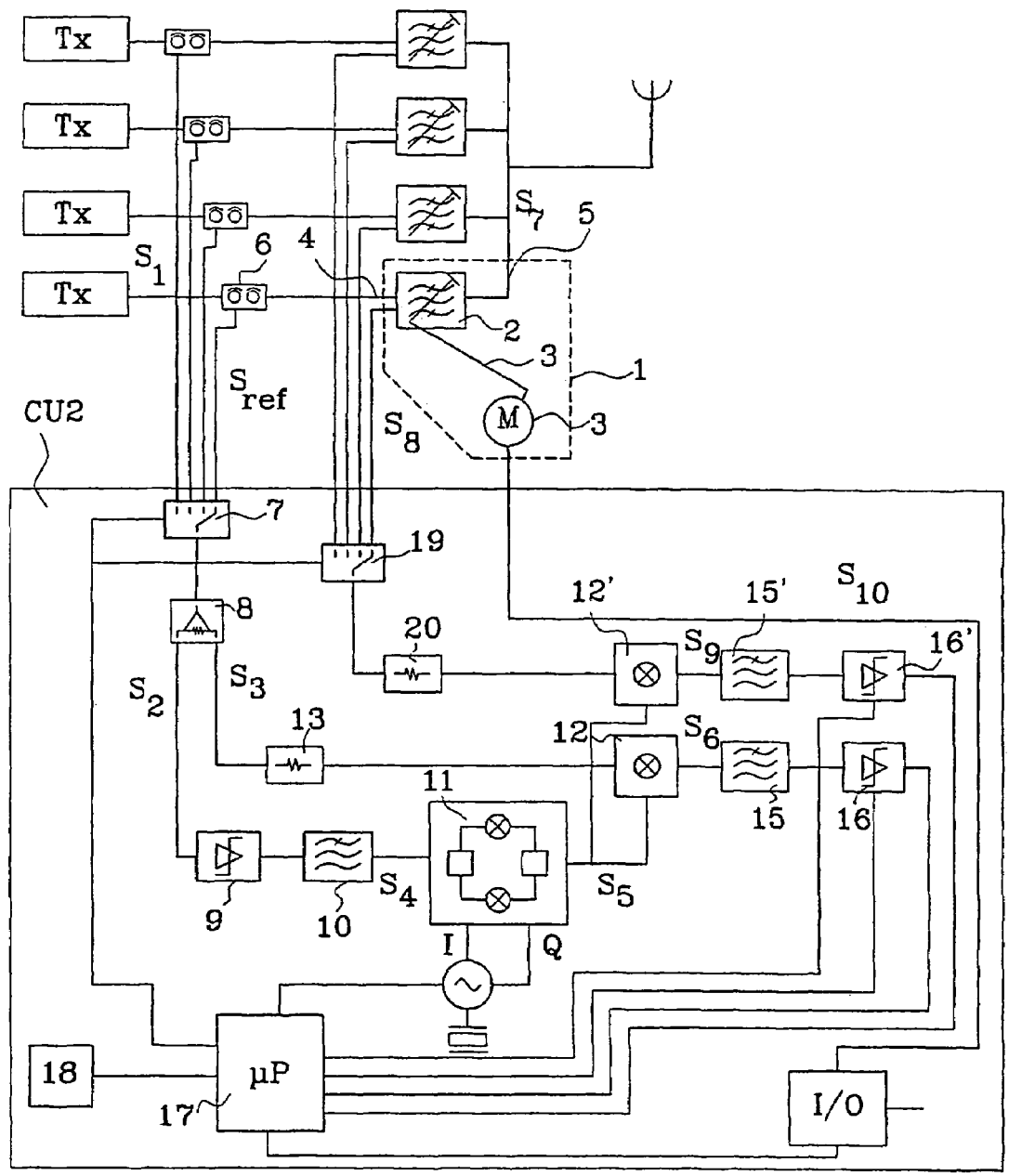
FIG. 2 shows an improvement of a filter with control circuits.

These disadvantages may be overcome by introducing a second regulation circuitry as described in FIG. 2.

FIG. 2 shows an alternative embodiment of a control unit CU2. All items that are identical to the items described in connection with FIG. 1 are denoted with the same reference numeral. The same apply for the other figures.

The main difference between the two control units in FIG. 1 and FIG. 2 is that the multiplexer 14 has been removed and been replaced by a second regulation circuitry (12', 15' 16'). The signal $S_3$ originating from the reference signal $S_{ref}$ is mixed with the signal $S_5$ in mixer 12 as previously described, but the measurement signal $S_8$ is fed into a second mixer 12'. The signal $S_5$ is also fed to the second mixer 12', which produces from signals $S_5$ and $S_8$ a mixing product $S_9$ which is fed to a second low-pass filter 15' and a third limiting amplifier 16' to the microprocessor 17.

By introducing the second regulation circuitry it is possible to measure the reference signal $S_{ref}$ and the measurement signal $S_8$ at the same time, but only for one resonator module at a time.

Figure 3:
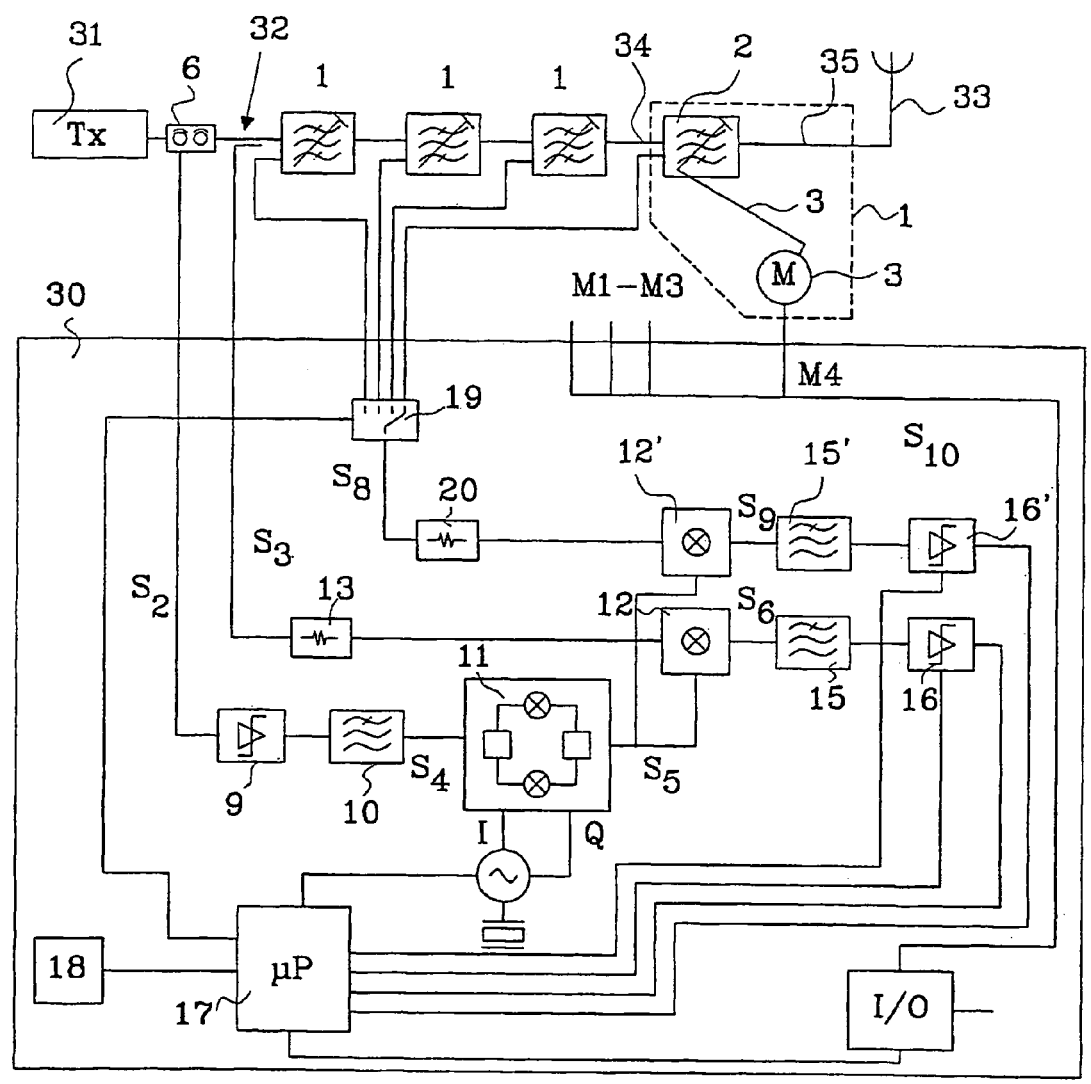
FIG. 3 shows a first embodiment of a filter with control circuits according to the invention.

A way of achieving filters having a better filter characteristics, such as high roll-off (i.e. sharper edges) is to arrange in cascade at least two resonator modules as shown in FIG. 3.

FIG. 3 shows a first embodiment of a control unit 30, being connected to a filter, comprising four cascaded resonator modules 1, an isolator 6, a transmitter 31, a sensor 32 and an antenna 33. Each resonator module 1 comprising a resonator 2, a tuning mechanism 3, a probe, a resonator input connection 34 and a resonator output connection 35.

In this embodiment the control unit, the power splitter 8 is removed and replaced by the sensor 32 for sensing a signal corresponding to signal $S_3$ (reference signal) Furthermore, the multiplexer 7 is omitted since only one input signal $S_1$ is provided into the filter from the transmitter 31. The input signal $S_1$ may have an arbitrary bandwidth and shape. A signal corresponding to signal $S_2$ from the isolator 6 is fed directly to the limiting amplifier 9.

Each probe provided at each resonator module 1 is connected to the multiplexer 19 in the same way as previously described with the exception that the resonator modules are now cascade coupled which means that the first resonator output connection is the same as the second resonator input connection and so on.

The microprocessor 17 controls the multiplexer 19 so that a measurement signal $S_8$ from each resonator module is fed to the second mixer 12' at the same time as a reference signal $S_3$ is fed to the first mixer 12. It is essential that the reference signal $S_3$ and the signal within the resonator are determined at the same time, due to variations in time of the input signal $S_1$ and the size of the time slot within which the measurements are performed.

The measured phase differences originating from the measurement signals $S_8$ are stored in the memory as a first set of relative phase differences. The measured phase measurements originating from the reference signal $S_3$ is also stored in the memory as a set of phase references.

A second set of relative phase differences is determined by comparing the first set of relative phase differences with the set of phase references. The tuning mechanism 3 of each resonator module 1 is thereafter adjusted to a predetermined set of values. The tuning procedure for cascade coupled resonator modules is well described in the Swedish patent application SE 0004658-1 filed 15 Dec. 2000 (Allgon AB), which is hereby incorporated as reference.

Figure 4:
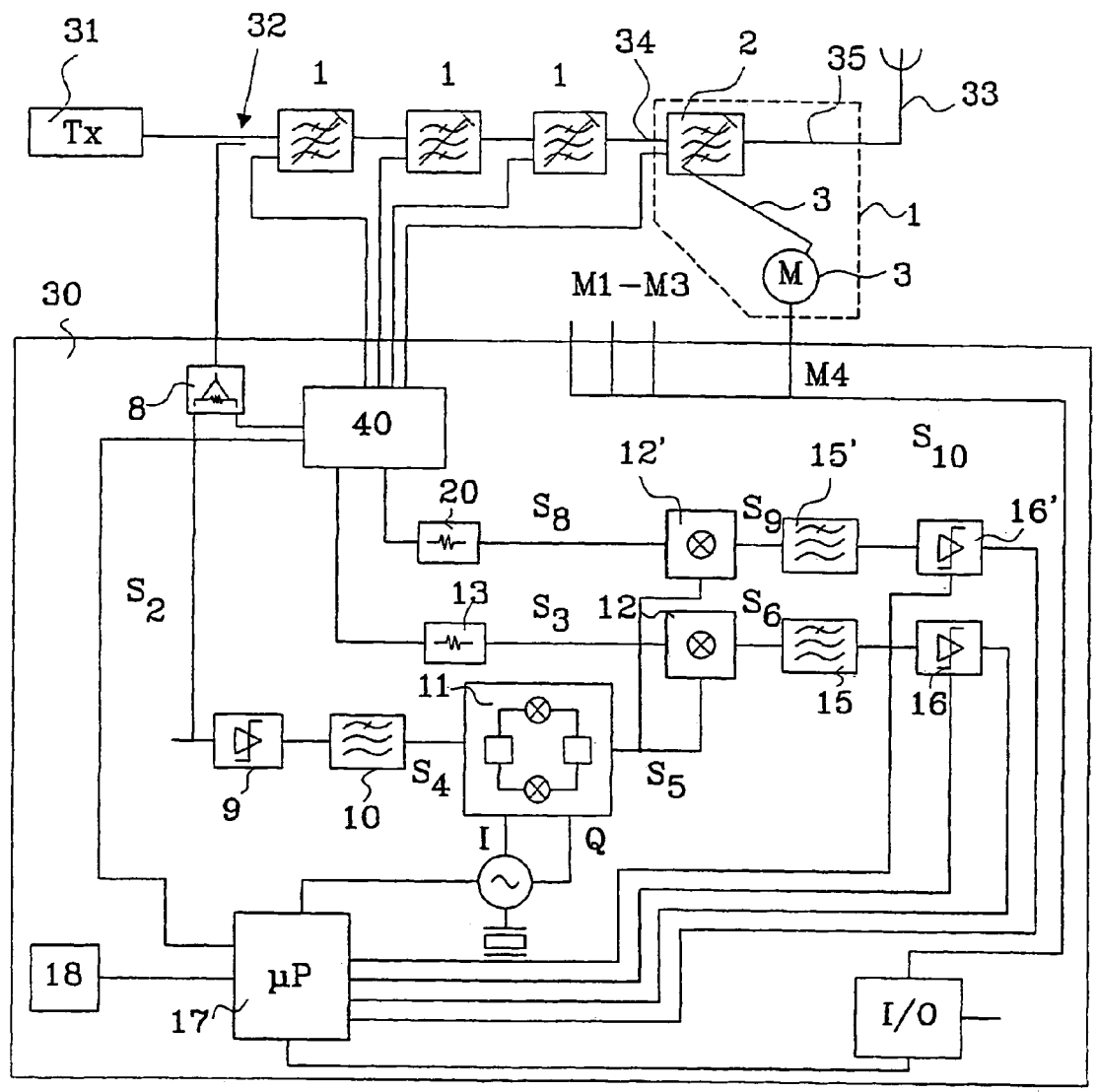
FIG. 4 shows a second embodiment of a filter with control circuits according to the invention.

FIG. 4 shows a second embodiment of a control unit according to the invention, where the third multiplexer 19 is removed and replaced with a software controlled switch 40. The power splitter 8 from FIGS. 1 and 2 is implemented in this embodiment, connected to the sensor 32, which previously was used for the reference signal $S_3$. All four probes are connected to the software controlled switch 40, which in turn is connected to the two attenunators 13 and 20. The switch 40 is controlled by the microprocessor 17.

The software controlled switch 40 may be configured in many ways. One way is to configure it to operate as the embodiment described in connection with FIG. 3, an alternative way is described below.

The software may be configured so that instead of comparing each relative phase with the corresponding phase reference, the relative phase difference over a single resonator module may be used. This is illustrated by way of example.

A first comparison is performed between the phase reference and the relative phase of a measurement signal $S_8$ from the first resonator module, which is connected to the input connection, which in turn is connected to the transmitter (or transceiver) to feed the input signal $S_1$ into the filter. The relative phase difference over the first resonator module can now easily be calculated.

A second comparison is performed between the relative phase of the measurement signal from the first resonator body and the relative phase of a measurement signal from the second resonator module. The relative phase difference over the second resonator module can now easily be calculated and thereby also the relative phase difference over the first two resonator modules, since the phase difference over the first resonator module is known from the previous measurement.

A third and a fourth comparison is performed in a similar way, and a result, describing the relative phase difference for each resonator module, identical to that in FIG. 3 may be obtained. This result is used to adjust the tuning mechanisms of the resonator modules so that the relative phase difference move towards a set of predetermined values.

The described embodiments of the invention only discloses control units having two regulation circuits for simultaneously measuring an unknown phase difference in relation to a phase reference, but it is of course possible to add further regulation circuits, up to one for each tunable resonator module.

A large variety of filters, comprising at least two cascade coupled tunable resonator modules, are also disclosed in SE 0004658-1, which may be used in connection with the described control unit.

Although all described embodiments only disclose a probe measuring each resonator output signal within the resonator module it may also comprise of a signal originating from a resonator output signal present on a resonator output connection.

In all embodiments there are some kind of switching between each measurement, and the microprocessor waits a short time period before starting the next measurement due to time delay in the signal during the switching.

The prior art document seeks to provide a control unit having a minimum number of parts, due to manufacturing costs, but mainly for avoiding the drawback of having two separate regulation circuits. The mixer, filter and/or amplifier may have different characteristics or age at a different pace. These drawbacks are acceptable in this application, since the regulation circuits operate at a low frequency. Low frequency means less changes due to temperature variations in the filter. The initial differences due to different characteristics may be calibrated away.

The invention claimed is:

1. A method for tuning a radio filter, said filter being operable in a frequency range and comprising a filter input connection, a filter output connection and at least two resonator modules, each of said at least two resonator modules having a tuning mechanism, said filter being adapted to receive at least one filter input signal being within said frequency range, characterised in that the method is performed with a radio filter having at least two of said resonator modules coupled in cascade, whereof a first resonator module being connected to said filter input connection and a final resonator module being connected to said filter output connection, said method comprising the steps of:
  (a) mixing said filter input signal with a low frequency signal so as to generate a single side band signal,
  (b) mixing each resonator output signal with the single side band signal, said resonator output signal being offset in phase from said filter input signal each by a first set of relative phase differences dependent on a present tuning of each resonator module, each resonator output signal being one in a group consisting of: a signal originating from a resonator output signal present on a resonator output connection, and a signal probed within the resonator module,
  (c) mixing the single side band signal with a reference signal originating from the input signal on the input connection,
  (c1) wherein the mixing in step (b) and the mixing in step (c) is performed simultaneously for each resonator module, so as to obtain a set of phase references,
  (d) comparing, at a frequency range about that of the low-frequency signal, mixing products resulting from step (b) and (c), respectively, for each of said at least two resonator modules, so as to determine a second set of relative phase differences between the filter input and resonator output signals, and
  (e) operating, based on said second set of phase differences, the tuning mechanisms to tune each resonator module, so as to adjust said second set of phase differences to a set of predetermined values.

2. A method for tuning a radio filter, said filter being operable in a frequency range and comprising a filter input connection, a filter output connection and at least one resonator module, each resonator module having a tuning mechanism, said filter being adapted to receive at least one filter input signal being within said frequency range, characterised in that the method comprising the steps of:
  (a) mixing said filter input signal with a low frequency signal so as to generate a single side band signal,
  (b) mixing each resonator output signal with the single side band signal, said resonator output signal being offset in phase from said filter input signal each by a first set of relative phase differences dependent on a present tuning of each resonator module, each resonator output signal being one in a group consisting of: a signal originating from a resonator output signal present on a resonator output connection, and a signal probed within the resonator module,
  (c) mixing the single side band signal with a reference signal originating from the input signal on the input connection,
  (c1) wherein the mixing in step (b) and the mixing in step (c) is performed simultaneously for each resonator module, so as to obtain a set of phase references,
  (d) comparing, at a frequency range about that of the low-frequency signal, mixing products resulting from step (b) and (c), respectively, for each resonator module, so as to determine a second set of relative phase differences between the filter input and each resonator output signal, and
  (e) operating, based on said second set of phase differences, the tuning mechanisms to tune each resonator module, so as to adjust said second set of phase differences to a set of predetermined values.

3. The method according to claim 2, wherein said method is performed with a radio filter having at least two resonator modules coupled in cascade, whereof a first resonator module being connected to said filter input connection and a final resonator module being connected to said filter output connection.

4. The method according to claim 1, wherein said reference signal used in step (c) is measured at the filter input connection of said filter.

5. The method according to claim 1, wherein said reference signal used in step (c) is measured at the first resonator input connection.

6. The method according to claim 1, wherein all resonator output signals in step (b) and said reference signal in step (c) are mixed simultaneously with the single side band signal.

7. A system for tuning a radio filter being operable in a frequency range comprising a filter input connection, a filter output connection and at least one resonator module, each resonator module having a tuning mechanism, characterised in that said system comprising
  at least one single side band generator to generate a single side band signal,
  a first mixer to mix each resonator output signal with the single side band signal, said resonator output signal being offset in phase from said filter input signal each by a first set of relative phase differences dependent on a present tuning of each resonator module, each resonator output signal being one in a group consisting of: a signal originating from a resonator output signal present on a resonator output connection, and a signal probed within the resonator module,
  a second mixer to mix a reference signal originating from an input signal on said filter input connection,
  means for simultaneously mixing the resonator output signal and the reference signal with the single side band signal,
  means for comparing the mixing products from the first and the second mixer for each resonator module to determine a second set of relative phase differences between the filter input and each resonator output signal, and
  means to operate each tuning mechanism, based on said second set of phase differences, to tune each resonator module, so as to adjust said second set of phase differences to a set of predetermined values.

8. The system according to claim 7, wherein said radio filter comprises at least two resonator modules coupled in cascade, whereof a first resonator module is connected to said filter input connection and a final resonator module is connected to said filter output connection.

9. A system for tuning a radio filter being operable in a frequency range comprising a filter input connection, a filter output connection and at least two resonator modules, each of said at least two resonator modules having a tuning mechanism, characterised in that at least two of said resonator modules are coupled in cascade, whereof a first resonator module is connected to said filter input connection and a final resonator module is connected to said filter output connection, said system comprising at least one single side band generator for generating mixing product signals from reference signals originating from a broad band input signal on said filter input connection and an output signal from each of said at least two resonator modules, said mixing product signals being indicative of a phase difference between said reference signals and said output signals, and means to simultaneously establish the mixing product signals from the reference signals and the mixing product signals from the output signal from each resonator module.

10. The system for tuning a radio filter according to claim 9, wherein said means to simultaneously establish the mixing product signals are at least two mixers which are fed by a frequency offset signal generated in said signal side band generator using a low-frequency signal.

* * * * *